United States Patent [19]

Chan

[11] Patent Number: 5,022,010

[45] Date of Patent: Jun. 4, 1991

[54] WORD DECODER FOR A MEMORY ARRAY

[75] Inventor: Yuen H. Chan, Poughkeepsie, N.Y.

[73] Assignee: International Business Machines Corporation, Armonk, N.Y.

[21] Appl. No.: 428,793

[22] Filed: Oct. 30, 1989

[51] Int. Cl.[5] .................. G11C 7/00; G11C 8/00; H03K 19/094

[52] U.S. Cl. ..................... 365/230.06; 365/177; 307/449; 307/463

[58] Field of Search ........... 307/446, 449, 463, 570; 365/203, 230.06, 177, 233

[56] References Cited

U.S. PATENT DOCUMENTS

| | | | |
|---|---|---|---|
| 3,541,353 | 11/1970 | Seelbach et al. | 307/246 |
| 3,614,467 | 10/1971 | Tu | 307/215 |
| 3,942,162 | 3/1976 | Buchanan | 340/173 R |
| 4,099,162 | 7/1978 | von Basse | 340/166 R |
| 4,104,735 | 8/1978 | Hofmann et al. | 365/230 |
| 4,112,314 | 9/1978 | Gani et al. | 307/215 |
| 4,185,320 | 1/1980 | Takemae et al. | 365/203 |
| 4,198,700 | 4/1980 | Aoyama et al. | 365/230 |
| 4,330,851 | 5/1982 | White, Jr. | 365/202 |
| 4,429,374 | 1/1984 | Tanimura | 365/230 |
| 4,455,627 | 6/1984 | Oritani | 365/226 |
| 4,514,829 | 4/1985 | Chao | 365/189 |
| 4,528,646 | 7/1985 | Ochii et al. | 365/203 |
| 4,558,234 | 12/1985 | Suzuki et al. | 307/446 |
| 4,563,754 | 1/1986 | Aoyama et al. | 365/190 |
| 4,578,779 | 3/1986 | Chan et al. | 365/190 |
| 4,596,002 | 6/1986 | Chan et al. | 365/189 |
| 4,598,390 | 7/1986 | Chan | 365/230 |
| 4,604,533 | 8/1986 | Miyamoto et al. | 307/530 |
| 4,612,631 | 9/1986 | Ochii | 365/203 |
| 4,616,146 | 10/1986 | Lee et al. | 307/446 |
| 4,636,983 | 1/1987 | Young et al. | 365/181 |
| 4,636,990 | 1/1987 | Buscaglia et al. | 365/230 |
| 4,638,186 | 1/1987 | McLaughlin | 307/446 |
| 4,639,898 | 1/1987 | Sauer | 365/202 |
| 4,644,500 | 2/1987 | Yonezu et al. | 365/189 |
| 4,649,295 | 3/1987 | McLaughlin et al. | 307/446 |
| 4,658,381 | 4/1987 | Reed et al. | 365/203 |
| 4,661,723 | 4/1987 | Masuda et al. | 307/446 |
| 4,668,879 | 5/1987 | Dansky et al. | 307/454 |
| 4,678,940 | 7/1987 | Vasseghi et al. | 307/446 |
| 4,694,202 | 9/1987 | Iwamura et al. | 307/475 |
| 4,694,433 | 9/1987 | Wiedmann | 365/230 |
| 4,701,642 | 10/1987 | Pricer | 307/446 |
| 4,713,796 | 12/1987 | Ogiue et al. | 365/189 |
| 4,728,827 | 3/1988 | Woo | 307/481 |
| 4,730,279 | 3/1988 | Ohtani | 365/203 |
| 4,733,110 | 3/1988 | Hara et al. | 307/446 |
| 4,739,497 | 4/1988 | Itoh et al. | 365/189 |
| 4,740,921 | 4/1988 | Lewandowski et al. | 365/189 |
| 4,746,817 | 5/1988 | Banker et al. | 307/446 |
| 4,752,913 | 6/1988 | Chan et al. | 365/190 |
| 4,779,014 | 10/1988 | Masuoka et al. | 307/446 |
| 4,817,057 | 3/1989 | Kondo et al. | 365/203 |
| 4,831,285 | 5/1989 | Gaiser | 307/465 |
| 4,858,194 | 8/1989 | Terada et al. | 365/203 |
| 4,862,421 | 8/1989 | Tran | 365/189.07 |
| 4,866,674 | 9/1989 | Tran | 365/189.11 |

FOREIGN PATENT DOCUMENTS 0185156  6/1986  European Pat. Off. ............. 365/63
8905547  6/1989  PCT Int'l Appl. .

(List continued on next page.)

Primary Examiner—Stuart N. Hecker
Assistant Examiner—Jack A. Lane
Attorney, Agent, or Firm—Otho B. Ross; Richard A. Romanchik

[57] ABSTRACT

A word decoder for a memory array includes a decode NOR/OR circuit 52 coupled to an output driver circuit 54. Decode NOR/OR circuit 52 includes a plurality of input signals IN1, IN2, IN3 connected to respective input n-channel field effect transistor (NEFTs) N1, N2, N3, all of which are parallel to a common node 1. The first input IN1 is also connected to a an active pull-up p-channel field effect transistor (PFETs) P1 which is in series with the first NFET N1 and always maintained slightly on. A bipolar transistor T4 pulls down node 1 and a pair of bleeder NFETs N4, N5 pull down nodes 3 and 2, respectively. Output driver circuit 54 is comprised of bipolar transistors T1, T2, T3 arranged in a push-pull configuration.

5 Claims, 11 Drawing Sheets

OTHER PUBLICATIONS

IEEE Journal of Solid-State Circuits, vol. 23, No. 5, pp. 1041-1047, H. Tran et al., "An 8-ns 256K ECL SRAM with CMOS Memory Array and Battery Backup Capability".

IEEE Journal of Solid-State Circuits, vol. 23, No. 5, pp. 1048-1053, R. Kertis et al., "A 12-ns ECL I/O 236K X 1-Bit SRAM Using A 1μm BICMOS Technology".

IEEE International Solid-State Circuits Conference, Digest of Technical Papers, M. Odaka et al., "A 512kb/5ns BiCMOS RAM with 1kG/150ps Logic Gate Array".

1989 IEEE International Solid-State Circuits Conference, Digest of Technical Papers, W. Heimsch et al., "Merged CMOS/Bipolar Current Switch Logic".

1989 IEEE International Solid-State Circuits Conference, Digest of Technical Papers, H. Tran et al., "An 8ns BiCMOS 1Mb ECL SRAM with a Configurable Memory Array Size".

1989 IEEE International Solid-State Circuits Conference, Digest of Technical Papers, M. Suzuki et al., "A 3.5ns, 500 mW 16kb BiCMOS ECL RAM".

IBM Technical Disclosure Bulletin, vol. 17, No. 11, pp. 3338-3339, R. Linton et al., "Low-Power FET Storage Cell".

IBM Technical Disclosure Bulletin, vol. 28, No. 11, p. 5112, R. Kroesen et al., "Receiver Circuit with Differential Current Switch Logic Output".

IEEE Journal of Solid-State Circuits, vol. sc-21, No. 5, pp. 681-685, K. Ogiue et al., "13-ns, 500-mW, 64-kbit ECL RAM Using HI-BICMOS Technology".

FIG. 1

FIG. 2    BIT ADDRESSING / DECODING SCHEME

ADDRESS RECEIVER CIRCUIT

FIG. 3

ADDRESS GATE RECEIVER CIRCUIT

BIT SELECT CIRCUIT

FIG. 6

FIG. 7  WORD ADDRESSING / DECODING SCHEME

WORD DECODER CIRCUIT

FIG. 8

| BIT ADDRESS INPUT (FIG. 2) | BIT ADDRESS RECEIVER OUTPUT | FIRST LEVEL DECODE | |
|---|---|---|---|
| J (B0) | J J J J $\bar{J}$ $\bar{J}$ $\bar{J}$ $\bar{J}$ | J + K + L (BA0) $J + K + \bar{L}$ (BA1) $J + \bar{K} + L$ (BA2) | |
| K (B1) | K K K K $\bar{K}$ $\bar{K}$ $\bar{K}$ $\bar{K}$ | $J + \bar{K} + \bar{L}$ (BA3) $\bar{J} + K + L$ (BA4) $\bar{J} + K + \bar{L}$ (BA5) | GROUP 1 |
| L (B2) | L L L L $\bar{L}$ $\bar{L}$ $\bar{L}$ $\bar{L}$ | $\bar{J} + \bar{K} + L$ (BA6) $\bar{J} + \bar{K} + \bar{L}$ (BA7) | |
| M (B3) | M M M M $\bar{M}$ $\bar{M}$ $\bar{M}$ $\bar{M}$ | M + N + O (BA8) $M + N + \bar{O}$ (BA9) $M + \bar{N} + O$ (BA10) | |
| N (B4) | N N N N $\bar{N}$ $\bar{N}$ $\bar{N}$ $\bar{N}$ | $M + \bar{N} + \bar{O}$ (BA11) $\bar{M} + N + O$ (BA12) $\bar{M} + N + \bar{O}$ (BA13) | GROUP 2 |
| O (B5) | O O O O $\bar{O}$ $\bar{O}$ $\bar{O}$ $\bar{O}$ | $\bar{M} + \bar{N} + O$ (BA14) $\bar{M} + \bar{N} + \bar{O}$ (BA15) | |
| P (B6) | P P $\bar{P}$ $\bar{P}$ | P + Q (BA16) $P + \bar{Q}$ (BA17) | GROUP 3 |
| Q (B7) | Q Q $\bar{Q}$ $\bar{Q}$ | $\bar{P} + Q$ (BA18) $\bar{P} + \bar{Q}$ (BA19) | |

BIT ADDRESS TABLE

FIG. 9

| WORD ADDRESS INPUT FIG. 7 | WORD ADDRESS RECEIVER OUTPUT | FIRST LEVEL DECODE | |
|---|---|---|---|
| A (W0) | A A A A  $\bar{A}\ \bar{A}\ \bar{A}\ \bar{A}$ | $A + B + C$ (WA0)  $A + B + \bar{C}$ (WA1)  $A + \bar{B} + C$ (WA2) | |
| B (W1) | B B B B  $\bar{B}\ \bar{B}\ \bar{B}\ \bar{B}$ | $A + \bar{B} + \bar{C}$ (WA3)  $\bar{A} + B + C$ (WA4)  $\bar{A} + B + \bar{C}$ (WA5) | GROUP 1 |
| C (W2) | C C C C  $\bar{C}\ \bar{C}\ \bar{C}\ \bar{C}$ | $\bar{A} + \bar{B} + C$ (WA6)  $\bar{A} + \bar{B} + \bar{C}$ (WA7) | |
| D (W3) | D D D D  $\bar{D}\ \bar{D}\ \bar{D}\ \bar{D}$ | $D + E + F$ (WA8)  $D + E + \bar{F}$ (WA9)  $D + \bar{E} + F$ (WA10) | |
| E (W4) | E E E E  $\bar{E}\ \bar{E}\ \bar{E}\ \bar{E}$ | $D + \bar{E} + \bar{F}$ (WA11)  $\bar{D} + E + F$ (WA12)  $\bar{D} + E + \bar{F}$ (WA13) | GROUP 2 |
| F (W5) | F F F F  $\bar{F}\ \bar{F}\ \bar{F}\ \bar{F}$ | $\bar{D} + \bar{E} + F$ (WA14)  $\bar{D} + \bar{E} + \bar{F}$ (WA15) | |
| G (W6) | G G G G  $\bar{G}\ \bar{G}\ \bar{G}\ \bar{G}$ | $G + H + I$ (WA16)  $G + H + \bar{I}$ (WA17)  $G + \bar{H} + I$ (WA18) | |
| H (W7) | H H H H  $\bar{H}\ \bar{H}\ \bar{H}\ \bar{H}$ | $G + \bar{H} + \bar{I}$ (WA19)  $\bar{G} + H + I$ (WA20)  $\bar{G} + H + \bar{I}$ (WA21) | GROUP 3 |
| I (W8) | I I I I  $\bar{I}\ \bar{I}\ \bar{I}\ \bar{I}$ | $\bar{G} + \bar{H} + I$ (WA22)  $\bar{G} + \bar{H} + \bar{I}$ (WA23) | |

WORD ADDRESS TABLE

FIG. 10

FIG. 11  ARRAY SELECTION / DESELECTION WAVEFORMS

WORD DECODER FOR A MEMORY ARRAY

CROSS-REFERENCE TO RELATED U.S. APPLICATION

Reference is made to U.S. patent application Ser. No. 07/428,794, filed concurrently herewith, by Y. H. Chan, entitled "Bit Decode Scheme for Memory Arrays," and assigned to the assignee of the present invention.

BACKGROUND OF THE INVENTION

1. Field of the Invention

The present invention relates to a memory array and addressing circuitry for use therewith. More particularly, the invention relates to improved bit decoding, restoring and word decoding circuitry for a static random access memory (RAM) array. The invention may be implemented in BICMOS technology.

2. Description of the Related Art

Various bit decoding (also known as column decoding or selection) and word decoding (also known as row decoding or selection) schemes for memory arrays are known in the art. See, for example: Aoyama et al. U.S. Pat. No. 4,198,700; White U.S. Pat. No. 4,330,851; Tanimura U.S. Pat. No. 4,429,374; Chan et al. U.S. Pat. No. 4,578,779; Chan et al. U.S. Pat. No. 4,596,002; Chan U.S. Pat. No. 4,598,390; Ochii U.S Pat. No. 4,612,631; Sauer U.S. Pat. No. 4,639,898; and Chan et al. U.S. Pat. No. 4,752,913.

Chan et al. U.S. Pat. No. 4,752,913 (particularly FIGS. 5, 6, and 9) discloses improved bit decoder, bit select, word decoder and other circuits for use in an all-bipolar RAM employing CTS (complementary transistor switch) cells. Decoder circuitry for an all-CMOS static RAM is disclosed in Aoyama et al. U.S. Pat. No. 4,198,700 (particularly FIG. 6).

These and other prior art decoding schemes have, however, served specialized needs not applicable to CMOS or BICMOS static RAMs, or have suffered from several disadvantages. For example, a decode scheme for an all-bipolar array normally will not be able (and does not need) to provide a restore or precharge signal to the bit lines after a read or write operation. A restore signal is, however, needed for high-speed operation of a CMOS or BICMOS array. This restore signal also must be timed properly with the bit decode signal, and the restore timing circuitry (clock drivers, etc.) normally consists of separate circuitry in the prior art, which has increased cost and complexity.

All-bipolar decoders also draw large amounts of power and occupy considerable chip area. On the other hand, although all-CMOS decoders draw less power and are smaller, they are usually slower.

With the increasing size and complexity of memories, the associated addressing circuitry has likewise become increasingly complex. Thus, there is an increasing need to simplify functions and reduce circuitry wherever possible, as well as a need to reduce power, increase speed and increase circuit density.

SUMMARY OF THE INVENTION

The present invention is intended to remedy the above-mentioned disadvantages and provide, among other features, an improved bit decode and select scheme that provides both bit decode and restore functions without the need for separate restore timing circuitry. An improved word decode scheme is also provided. The invention is preferably implemented in BIC-MOS technology (i.e., a circuit having both bipolar and field-effect or MOS transistors (FETs) on the same semiconductor chip) to provide high speed operation and high density at relatively low power.

In one embodiment, the present invention comprises a memory comprising:

memory cells, each coupled to a word line;

BICMOS word address receiver circuits for receiving non-decoded word address signals and for generating intermediate word signals; and BICMOS word decoder circuits coupled to the word address receiver circuits for receiving the intermediate word signals and for generating word decode signals for output to the word line.

In another embodiment, the invention comprises a BICMOS word decode scheme for a static random access memory array, comprising:

a plurality of CMOS or BICMOS static RAM cells arranged in rows and columns;

a word line coupled to each row of cells;

a pair of bit lines coupled to each column of cells; and a bit decode and restore lines coupled to each pair of bit lines;

each word line being coupled to a BICMOS word decoder circuit, each decoder circuit comprising a BICMOS NOR/OR circuit portion coupled to a driver circuit portion, the NOR/OR circuit portion having three inputs coupled to first-level word decode outputs of a plurality of BICMOS word address receiver circuits.

Other variations and embodiments of the invention are also disclosed, and are discussed more fully in the detailed description below.

BRIEF DESCRIPTION OF THE DRAWINGS

To facilitate further description of the invention, the following drawings are provided in which.

DETAILED DESCRIPTION OF THE PREFERRED EMBODIMENT

Memory Array

Figure 1:
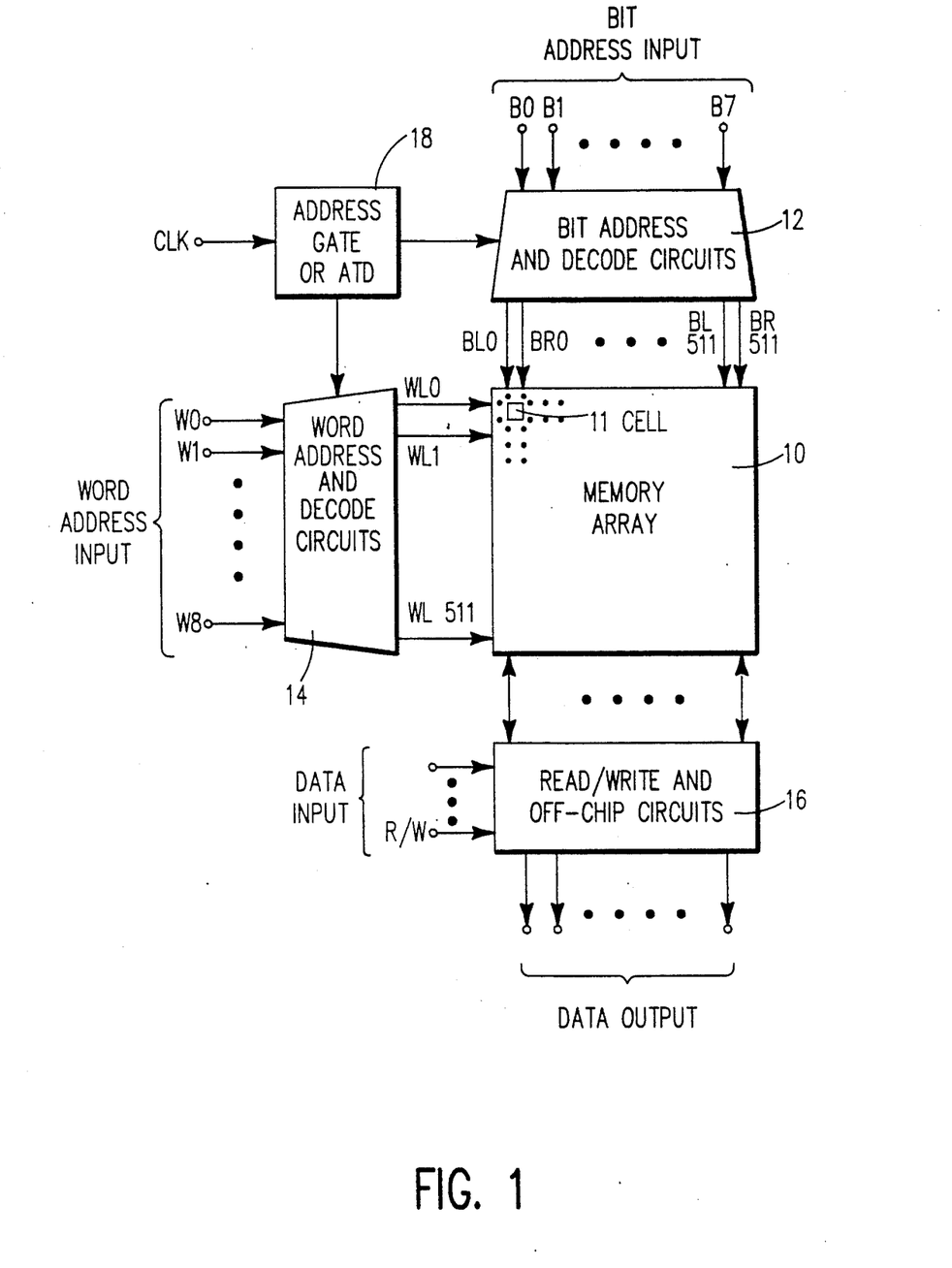
FIG. 1 is an overall block diagram of a memory array and its associated address and decode circuits in accordance with the invention.

Referring first to FIG. 1, there is shown therein an overall block diagram of a memory array and its associated addressing and other circuits, illustrating an environment in which the present invention may find application. The invention is not, however, limited to this particular environment or to the environment or configuration shown in any other drawing.

In FIG. 1, a memory array 10 is provided for the storage of binary data. The memory comprises a plurality of memory cells 11 arranged in rows and columns, in the form of a matrix. The preferred type of this memory is a static random access memory (static RAM, or SRAM), suitable for fabrication on a semiconductor chip. Each cell may be a conventional single-bit SRAM cell, such as a CMOS or BICMOS cell similar to that disclosed in the article entitled "Low-Power FET Storage Cell," by R. H. Linton, et al., in IBM *Technical Disclosure Bulletin,* Vol. 17, No. 11, pp. 3338-39 (April 1975), and elsewhere.

The memory is not limited to any particular size or organization, but in one embodiment it is a 256 Kbit SRAM, the array having 512 rows of cells and 512 columns of cells. The columns are divided into two data groups of 256 columns each, to permit the reading or writing of two bits of data simultaneously.

As shown in FIG. 1, each cell in each column is attached to a pair of bit lines (e.g., BL0 and BR0), and each cell in each row is attached to at least one word line (e.g., WL0). Individual cells are selected (addressed) for reading and writing by way of signals on the particular pair of bit lines and the word line for that cell. Cells are also "unselected" or restored (precharged) after each read or write operation via other signals on the same bit and word lines.

The bit address and restore signals are generated by bit address and decode circuits 12, and the word address signals are generated by word address and decode circuits 14. As shown in FIG. 1, the bit address circuits are configured to receive a plurality (e.g., eight) undecoded bit address inputs B0 . . . B7, and the word address circuits are configured to receive a plurality (e.g., nine) undecoded word address inputs W0 . . . W8. Because the columns are divided into two data groups, the eight bit address inputs are sufficient to select 2 out of 512 columns of the array, and the nine word address inputs will select 1 out of 512 rows.

Data is written into and read out of the array two bits at a time by way of read/write and off-chip circuits 16, and controlled by a read/write (R/W) signal. These circuits, which typically include conventional differential sense amplifiers and associated circuitry, may be expanded to handle more than two bits at a time, if desired.

A final element of FIG. 1 is a conventional address gate or address transition detect (ATD) block 18, which enables the address circuits 12 and 14 for memory cell selection at the correct time. For example, in a synchronous memory that is controlled by regular clock pulses, a clock pulse during a read or write portion of the memory cycle will cause gate 18 to select the cells. In an asynchronous memory, no clock pulse will be needed, but ATD 18 will enable the address circuits 12 and 14 when an address signal transition has been detected, in conventional fashion.

Bit Addressing and Decoding Scheme

Figure 2:
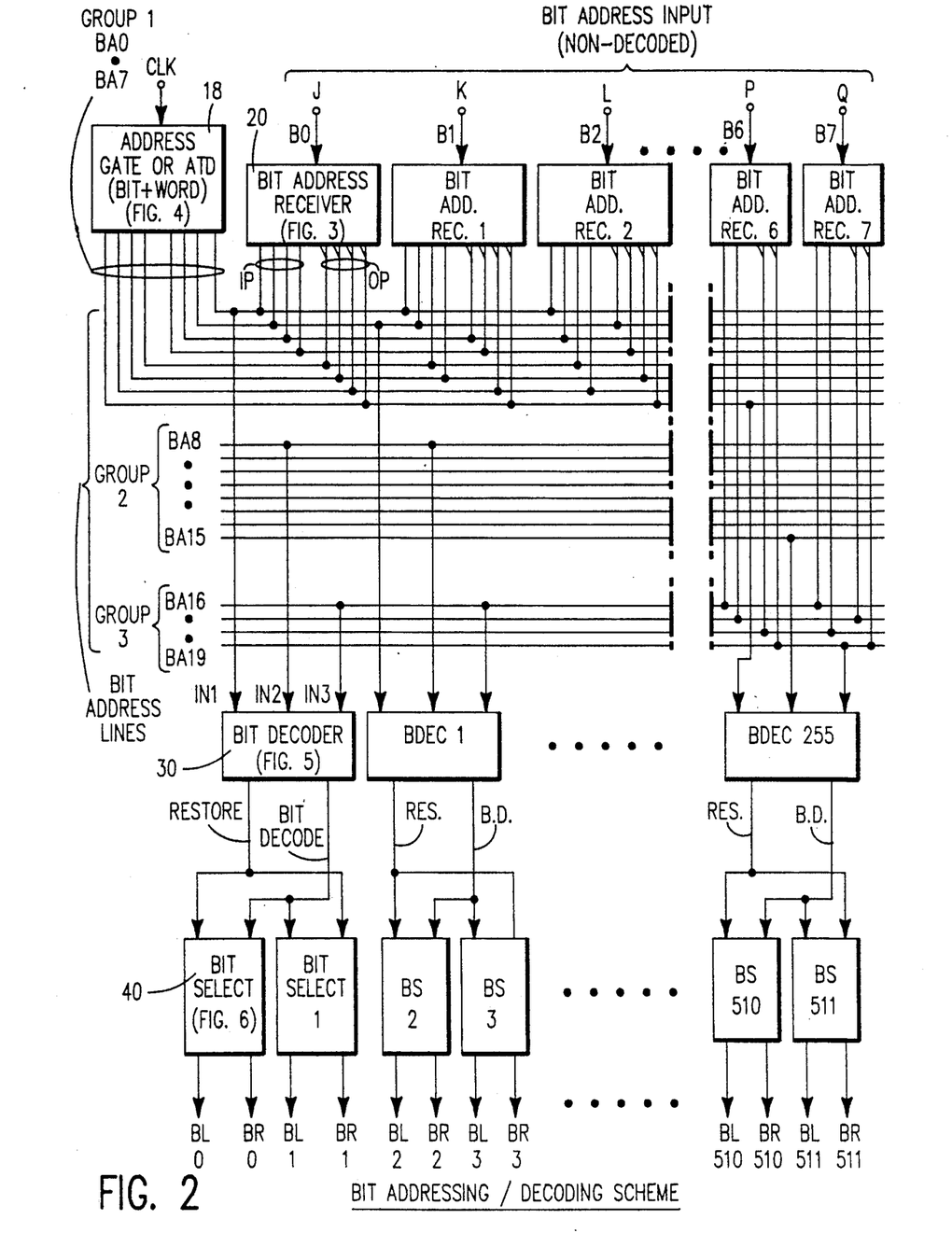
FIG. 2 is a block diagram of a memory bit address, decode and select scheme in accordance with the invention.
Figure 9:
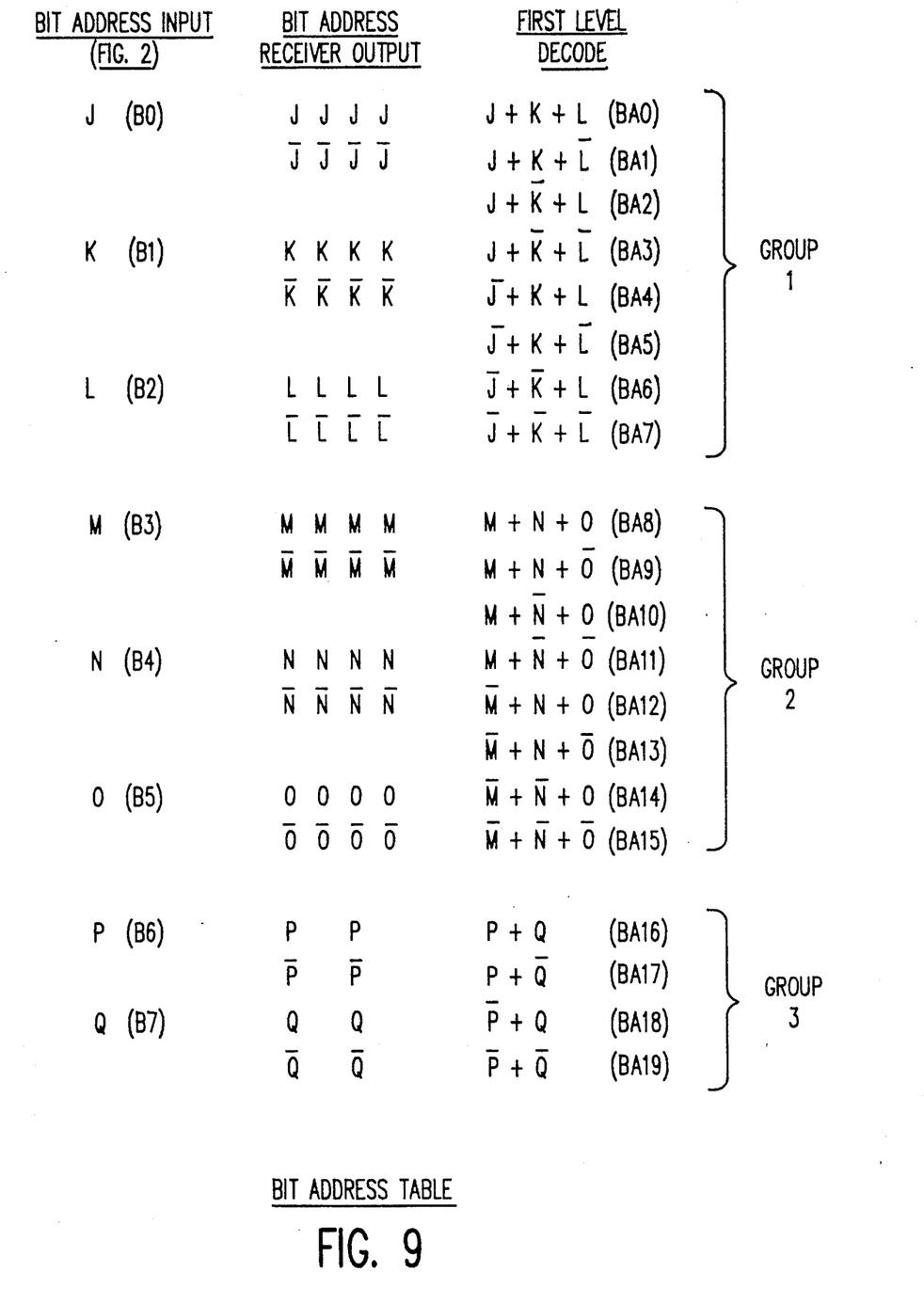
FIG. 9 is an address table showing a typical first-level (partially decoded) bit address output of the bit address receiver circuits 20 of FIG. 2.

Turning now to FIG. 2, there is shown a more detailed block diagram of the bit address and decode circuits 12 of FIG. 1, in accordance with the invention. In this two-level matrix decode scheme, a plurality of non-decoded bit address signal lines (B0...B7) are input to a plurality of bit address receiver circuits 20. Each bit address receiver, in this embodiment, has one input and a plurality of outputs to provide a first-level decode (partially decoded, or intermediate) bit address for one bit of the address. Receivers for bit inputs B0 through B5 (for inputs J-O) have eight outputs, and the receivers for bit inputs B6 and B7 (P and Q) have four outputs. In each case, half of the outputs are in-phase with the input (labelled "IP") and half of the outputs are out-of-phase (labelled "OP"). (See also FIG. 9.)

The outputs of the address receivers are connected to 20 bit address lines, BA0 . . . BA19, in various combinations to provide a complete first-level bit decode. These address lines are grouped into three groups—group 1 comprising BA0-BA7, group 2 comprising BA8-BA15 and group 3 comprising BA16-BA19—as shown in FIG. 2, for proper connection to a second level of decoding circuits for the bit address.

The second level of bit decoding is performed by a plurality of bit decoder circuits 30. To handle the bit decoding for a 256 Kbit SRAM, as in one embodiment of the present invention, 256 of the bit decoders 30 are required, each of which has a plurality of inputs, such as IN1, IN2 and IN3. Each input is connected to one line within each group of intermediate bit address lines (first level bit decode output lines), in various combinations.

Address gate 18 releases the first level outputs into the bit decoders when reading or writing is to begin and deselects the decoders during standby. As previously noted, gate 18 could operate in synchronous mode with a clock, or it could be replaced by an ATD circuit for asynchronous operation.

The two-level matrix bit decode scheme utilized in the present invention offers a significant advantage over a single-level scheme in terms of reduced fan-out on the bit address lines. A two-fold reduction of fan-out is achieved, (i.e., fan-out to only 64 decoders instead of to 128 decoders), and switching speed of the address lines is significantly improved. The number of inputs to each bit decoder is also reduced from 8 to 3. In addition, all circuits of the decode scheme may be fabricated on a single semiconductor chip, together with the array.

Another noteworthy feature of the present invention is that each bit decoder 30 provides two output lines—a bit decode output and a restore output—that are input to one or more bit select circuits 40. Each bit select circuit, in turn, has (e.g., BL0, BR0) that are connected to a column of memory cells.

Yet another feature of the invention is that each bit select circuit, in combination with its associated bit decoder circuit, generates both the bit select signals and the restore (or precharge) signals for the bit lines of the array in proper timed relationship (dual phase), as described more fully below. This is unlike prior art SRAMS, in which separate restore or precharge circuitry (particularly timing circuitry) typically must be provided to generate the restore signals.

Preferred embodiments of the address receiver circuit 20, address gate 18, bit decoder circuit 30 and bit select circuit 40 of the present invention are shown in more detail in FIGS. 3, 4, 5, and 6, respectively.

Address Receiver Circuit

Figure 3:
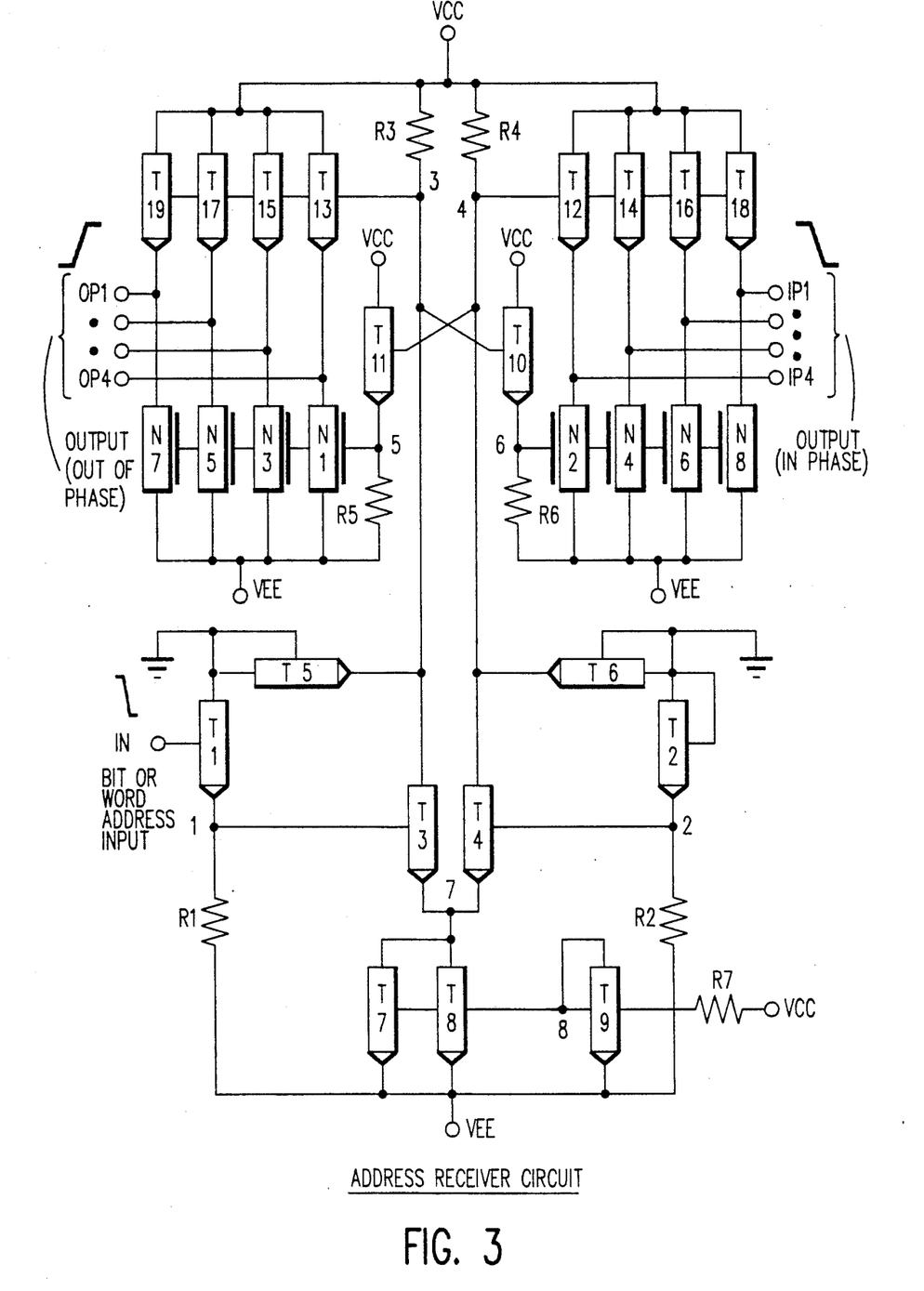
FIG. 3 is a schematic circuit diagram of an address receiver circuit 20 that may be employed in a memory address scheme (FIG. 2) in accordance with the invention.

FIG. 3 shows a BICMOS implementation of the address receiver circuit 20 of FIG. 2, in accordance with the invention. This circuit is of the current switch emitter follower type, with multiple dual-phase outputs, and may be used either as a bit address receiver or as a word address receiver for one bit of a bit or word address.

The address receiver circuit of FIG. 3 performs several functions, including: (1) providing true and complement outputs (IP1 . . . IP4 and OP1 . . . OP4, respectively) for a first level or intermediate decode; and (2) providing level translation for signals as they enter the memory address circuits from external circuits.

In this particular embodiment, 8 outputs are generated from one bit of a bit address or word address. Four outputs (IP1 . . . IP4) are in-phase with the input, and four outputs (OP1 . . . OP4) are out-of-phase with the input. The in-phase outputs are a bipolar push-pull circuit (bipolar NPN transistors T4 and T10) driving series-connected BICMOS pairs of transistors (bipolar T12 with FET N2, T14 with N4, T16 and N6 and T18 with N8). Similarly, the out-of-phase outputs are generated in another BICMOS portion of the circuit formed by a bipolar push-pull circuit (bipolar transistors T3 and T11) driving series-connected BICMOS pairs of transistors (T13 with N1, T15 with N3, T17 with N5, and T19 with N7).

Transistors T3, T4 and T7-T8 of the circuit of FIG. 3 are coupled in a current switch configuration and are driven by input transistor T1. Transistor T2 generates a voltage reference for the current switch input signal. Transistors T5 and T6 operate as downlevel clamps for nodes 3 and 4, respectively, so that T3 and T4 will not be switched into saturation region. Transistors T7, T8 and T9 form a current mirror current source.

The transistor pair T1 and T2 also act as a level translation circuit for current switch T3-T4. Level translation is needed for the situation where circuits external to the memory are of one type (e.g., ECL or TTL), and the decoders or memory cells are of a different type (e.g., CMOS or BICMOS), and the voltage levels of signals in each type of circuit are different. In this case, circuits prior to the address receiver will be bipolar, and the subsequent bit decoder and word decoder stages will be BICMOS circuits with CMOS inputs (described below). The small input ECL logic level swing (typically 1 volt) needs to be converted to a larger swing (typically 2 volts or higher) in order to drive the gates of input FETS in the decoder.

By providing input level translation in the address receiver circuit, the current switch stage (T3-T4) is capable of generating this relatively large voltage swing. This approach eliminates the need for any additional CMOS level translation devices in the address receiver or elsewhere, thus keeping circuit delay to a minimum.

Address Gate Receiver Circuit

Figure 4:
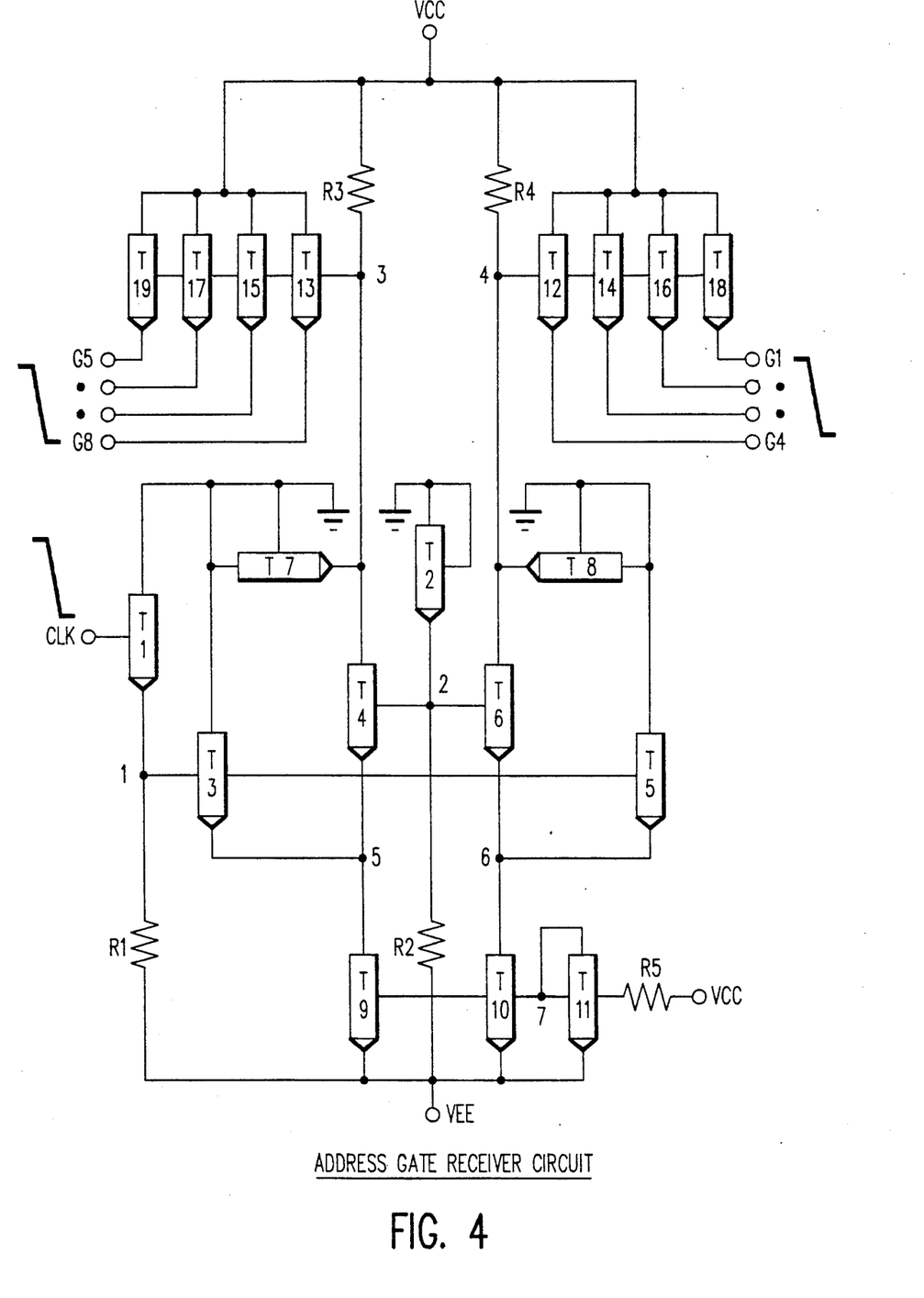
FIG. 4 is a schematic circuit diagram of an address gate receiver circuit 18 that may be employed in a memory address scheme (FIG. 2) in accordance with the invention.

FIG. 4 shows a bipolar implementation of the address gate receiver circuit 18 of FIGS. 1 and 2. This circuit, which is somewhat similar to the address receiver of FIG. 3, may be used both as a bit address gate and as a word address gate, as shown in FIG. 1. In a preferred embodiment, the address gate is used in a synchronous memory driven by an external clock, the address gate having 8 outputs G1-G8, all in phase with the input clock pulse but level shifted to CMOS level. For an asynchronous memory, the circuit of FIG. 4 could be replaced with a conventional address transition detect (ATD) circuit.

Bit Decoder Circuit

Figure 5:
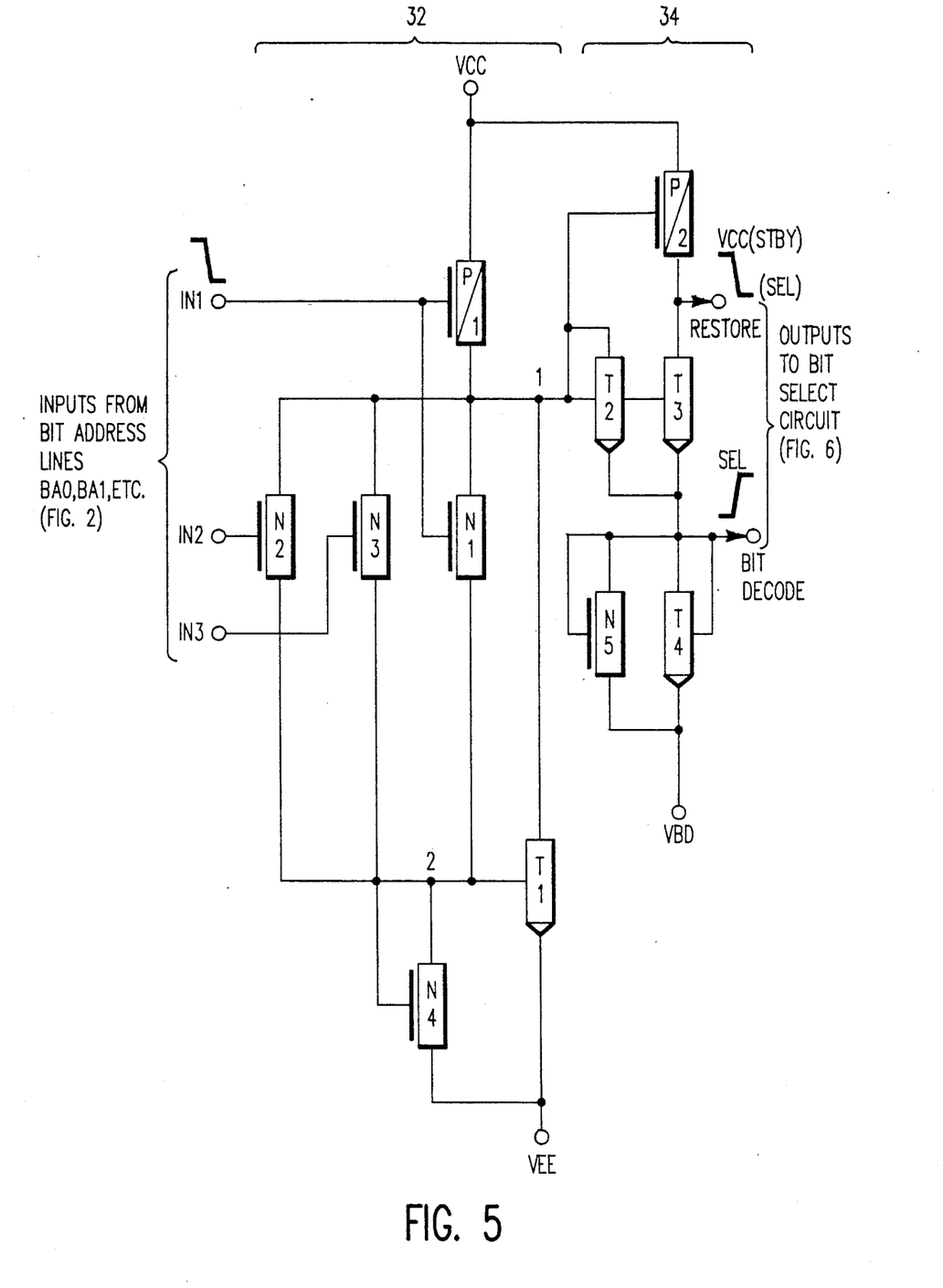
FIG. 5 is a schematic circuit diagram of a bit decoder circuit 30 that may be employed in a memory address scheme (FIG. 2) in accordance with the invention.

Turning now to FIG. 5, there is shown a BICMOS implementation of the bit decoder circuit 30 of FIG. 2, in accordance with the invention. A noteworthy feature of the invention is that the bit decoder circuit comprises a BICMOS decode portion 32 coupled to a BICMOS drive portion 34. Decode portion 32 also operates as a logical NOR circuit. The circuit of FIG. 5 has a plurality of inputs (three in the preferred embodiment, namely IN1, IN2 and IN3), and two outputs of opposite phase, namely "bit decode" and "restore." The inputs are taken from the bit address lines of FIG. 2 (one input from one line of each different group), and the outputs are coupled to the bit select circuits 40 of FIG. 2.

In the preferred embodiment, decode or NOR portion 32 comprises a 3-input, 1-output, 6-device circuit comprising 4 N-channel FETs (NFETs), one P-channel FET (PFET) and one NPN bipolar transistor. The inputs IN1, IN2 and IN3 are coupled, respectively, to the gates of three NFETs, N1, N2 and N3. Input IN1 is also coupled to the gate of a PFET P1, whose source-drain current path is coupled in series with the source-drain current path of N1 to form an inverter. The source-drain current paths of the input NFETs are all coupled in parallel between internal nodes 1 and 2 of this circuit. Device P1 has its source-drain current path coupled between node 1 and a first voltage source, Vcc. Node 1 provides the "output" of portion 32.

Another noteworthy feature of portion 32 of bit decoder circuit 30 of FIG. 5 of the invention is the bipolar transistor T1, which is an NPN transistor in the preferred embodiment. In a departure from the prior art, transistor T1 is used not only for fast transient discharge (pull-down) for node 1 when the decoder circuit is deselected, but is also used to help accomplish the basic NOR logical operation of portion 32. This is achieved via the clamping action that T1 performs on node 1 when either IN1, IN2, or IN3 is "high." To "counteract" P1, which tries to pull node 1 up during certain combinations of inputs, T1 must pull node 1 down to provide a proper logical NOR output. Portion 32 of FIG. 5 will not provide a correct logical NOR output signal at node 1 in the absence of bipolar transistor T1. Transistor T1 also helps reduce the effect of noise at the inputs IN1-IN3 on the output at node 1 (provides proper level control), and eliminates the need for series-connected PFET devices at the input, which provides increased speed.

Another feature of the invention is that PFET device P1 functions as an active pull-up device for node 1, and P1, in conjunction with device N1, also assists in the input decoding of the partially-decode (intermediate or first-level decode) bit address at IN1-IN3. Significantly, only one PFET device is needed for this circuit.

Still another feature of the invention is that P1 is always at least slightly "on," even in the standby mode. This is accomplished by properly adjusting the input "up" level taken from the address receiver circuit (FIG. 3), and by adjusting the PFET turn-on threshold voltage (for example, during manufacture). As IN1 goes from "off" to "on" (e.g., from "high" to "low,") the P1 output goes from "slightly on" to "fully on." This provides significantly increased speed for memory addressing, and hence reading and writing, operations.

To complete portion 32 of the circuit of FIG. 5, device N4 operates as an optional bleeder or discharge (pull-down) device for node 2, and devices N4 and T1 also operate together as a voltage clamp on node 1.

Portion 32 is coupled to a drive portion 34 of FIG. 5 at node 1. In the preferred embodiment, drive portion 34 comprises a 1-input, 2-output, 5-device BICMOS circuit having one signal input (at node 1), and two outputs—a "bit decode" (read/write) output and a "restore" (precharge) output. The bit decode output is taken from the emitter of bipolar transistor T3, and the restore output is taken from the collector of T3.

The bit decode output levels (both high and low) are controlled by an on-chip generated voltage source VBD, which is adjustable to provide flexible bit decode outputs. The bit decode output pull down is provided by NFET N5, and the restore output pull up is provided by PFET P2.

Bipolar transistor T2 operates as a current mirror up-level clamp, and provides both anti-saturation and stability functions for transistor T3. Bipolar transistor T4 also operates as an up-level clamp for the select level (high) at the bit decode output.

Bit Decoder Circuit Operation

Figure 11:
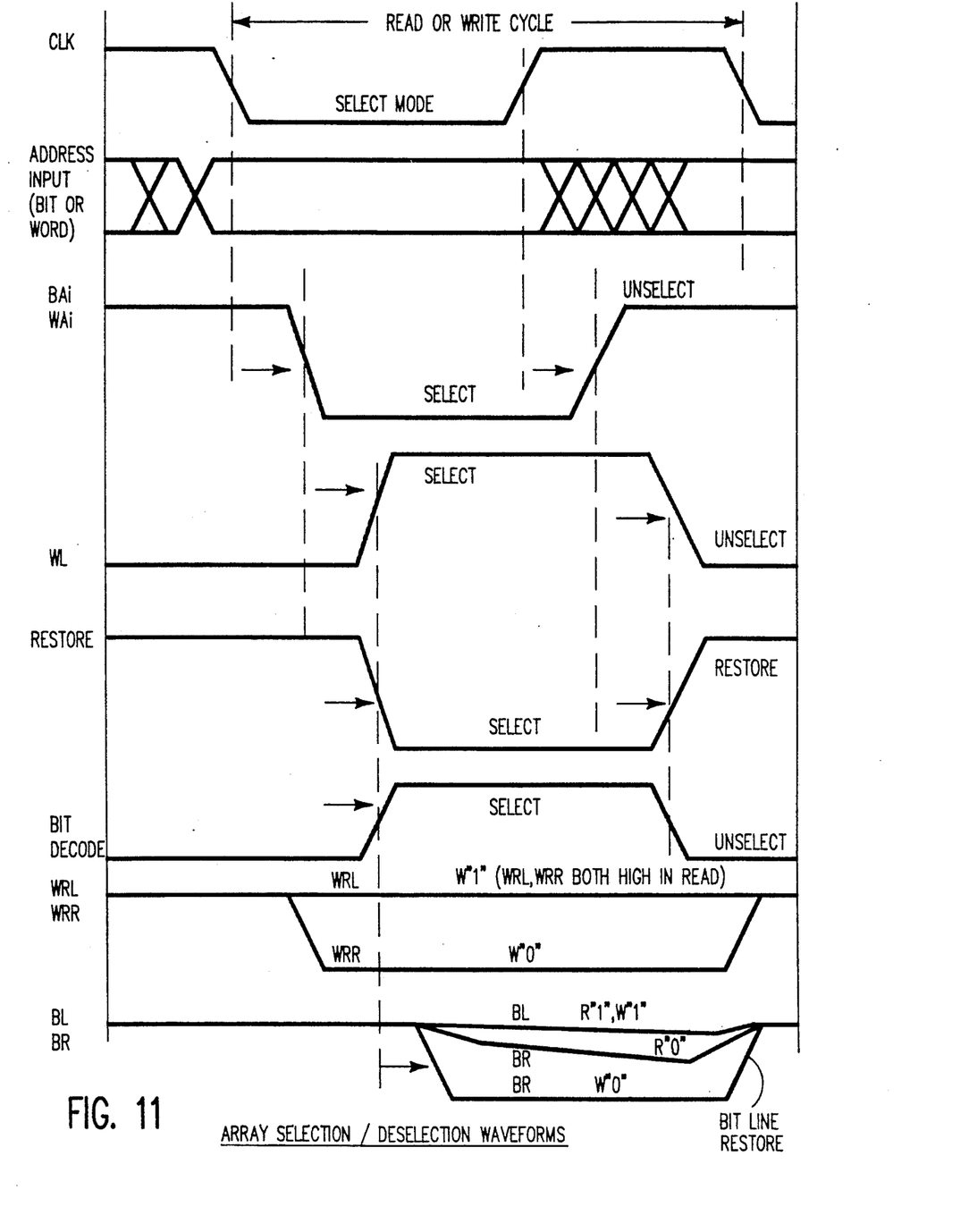
FIG. 11 is a series of waveform diagrams showing selection and deselection of the various bit, word and restore lines of the circuits of FIGS. 2, 5, 6, 7 and 8.

The operation of the bit decoder of FIG. 5 will now be described. Reference should also be made to the waveforms of FIG. 11.

All 3 of the inputs IN1, IN2 and IN3 in FIG. 5 must be low in order to select a decoder. The bit decoder has two outputs, "restore" and "bit decode," which are of opposite phases. The "restore" signal controls the restore functions in the bit select circuits, whereas the "bit decode" signal controls the read/write functions. Both the "restore" and "bit decode" lines fan out to drive two bit select circuits to provide the x2 organization for the array.

(i) Standby/ unselect state: In standby or unselect state, the outputs of address gate 18 (FIG. 3) are high. At least one input of the bit decoder (IN1, IN2 or IN3) is high to disable the decoder. In this state, the PMOS device P1 (FIG. 5) is maintained "lightly" ON because of the particular voltage level chosen as its threshold voltage, which is lower than a VBE voltage. The NMOS device N1 is turned "fully" ON to clamp down node 1. A small DC current supplied by P1 is conducted thru N1 to keep the pull down transistor T1 ON. In this state, the current mirror emitter follower (T2-T3) is shut OFF. Output "resistor" is high at VCC level and "bit decode" is a low at VRD being and on-chip voltage reference line at VBD (VBD being an on-chip voltage reference line which is a VBE above the VEE supply).

(ii) Select state: To select a bit decoder for a memory read or write operation, all three of the decoder inputs must be low. The NMOS devices N1-N3 are turned OFF, while the PMOS device P1 is switched from "lightly" ON to "fully" ON. Node 1 is thus pulled up to turn on the T2-T3 transistor pair. With T2-T3 being turned ON, output "bit decode" rises to an up level one VBE above the VBD line (clamped by T4), thus activating input transistors in bit select circuits (described below). While bit decode is rising, output restore is pulled low to a down level one VLE above the bit decode line. With restore being down, the restore devices are shut OFF, so that the bit lines are enabled for reading or writing.

Bit Select Circuit

Figure 6:
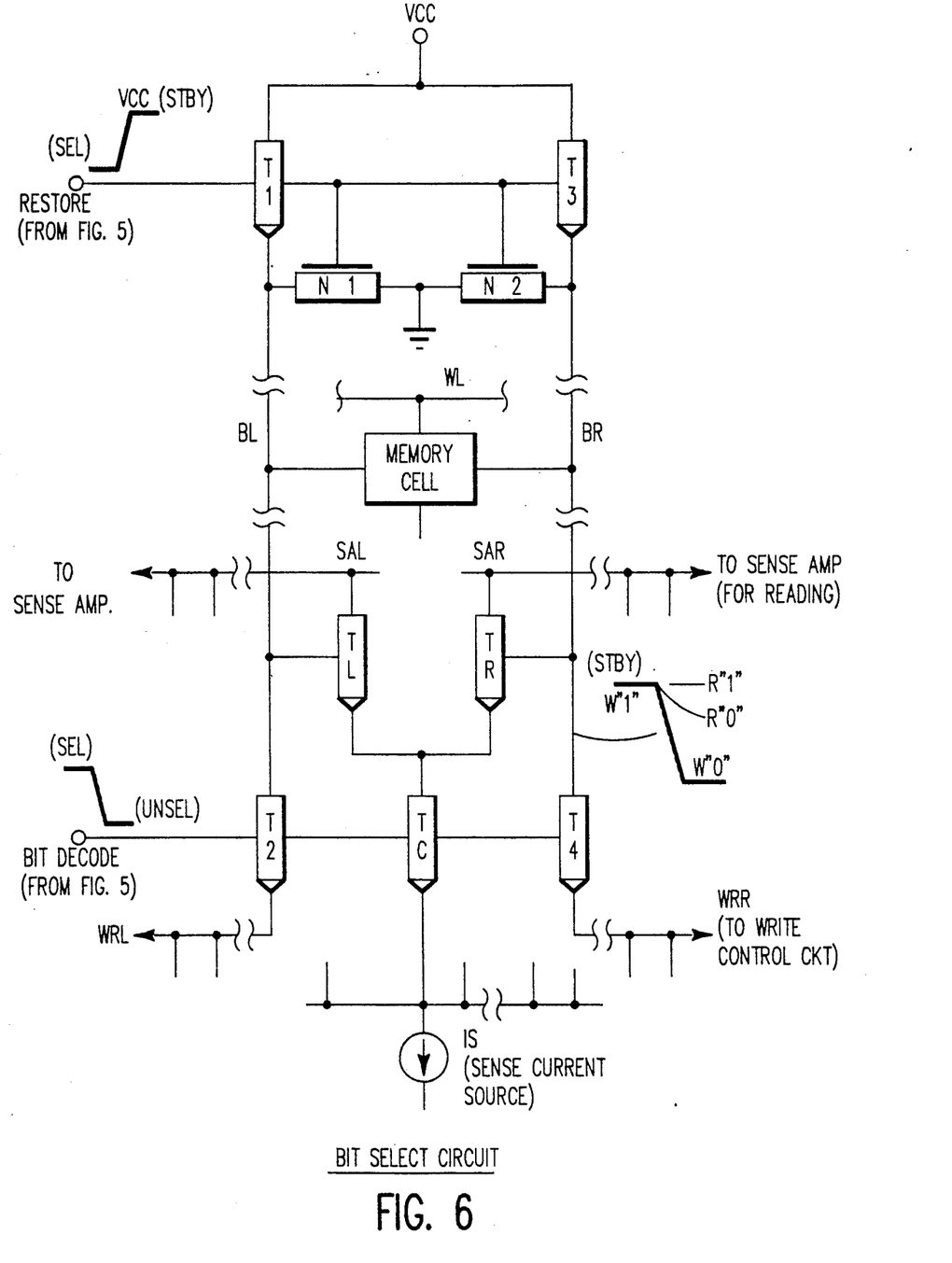
FIG. 6 is a schematic circuit diagram of a bit select circuit 40 that may be employed in a memory address scheme (FIG. 2) in accordance with the invention.

Operating in conjunction with each bit decoder circuit is a BICMOS bit select circuit 40 of FIG. 2, in accordance with the invention. A preferred embodiment of this circuit is shown in FIG. 6. Each bit select circuit is connected to a column of memory cells 11 via a pair of bit lines, BL and BR. The left bit line (BL) is coupled directly to the bit decode and restore outputs of FIG. 5 via bipolar transistors T2 and T1, respectively, and the right bit line (BR) is coupled directly to the bit decode and restore outputs via bipolar transistors T4 and T3, respectively.

Devices T2 and T4 operate as write drivers for the memory cells of this column, and devices T1 and T3 operate as restore drivers for such cells. The cells are read via a differential current switch consisting of TC, TL and TR, which feed into left sense amp line SAL and right sense amp line SAR, and then to sense amplifiers (not shown). The cells are written into via bipolar current switch arrangement comprising transistors T2 and T4 in conjunction with a write control circuit (not shown).

The NFET devices N1 and N2 operate as bleeder devices, which substitute for equalization devices. Devices N1 and N2 provide tighter control for T1 and T2 by keeping them ON in standby. N1 and N2 shut off when the bit lines are selected during a read or write operation.

Another noteworthy feature of the invention is that the bit select circuit of FIG. 6, operating with the bit decode circuit of FIG. 5, is able to provide both the bit decode signals and the restore signals to the memory cells of a particular column of cells of the array in proper timed (dual-phase) relationship, without the need for any external restore or precharge timing circuitry (such as a restore clock). In other words, the restore or precharge function (including the critical timing function) is built into the decode/select circuitry. In particular, the restore drivers T1 and T3 take their inputs directly from the restore output of the bit decoder circuit 30 of FIGS. 2 and 5.

Bit Select Circuit Operation

The operation of the circuit of FIG. 6 will now be described. Reference should also be made to the waveforms of FIG. 11.

The bit select circuit (FIG. 6) serves several functions, including restoring the bit lines and reading from and writing into the cells. The restore function is performed by the emitter followers T1 and T3 (N1 & N2 providing small bleeder currents to the emitter followers during standby to define bit line levels). When a bit column is selected, restore input goes low, and T1 and T3 are shut OFF to allow the bit lines to be read or written. When the bit column is deselected, T1 and T3 turned ON again to pull up the bit lines. This restore scheme has the advantage of much lower restore current, since only the selected bit lines have to be restored. The unselected bit lines will remain unchanged.

Reading of the bit column is performed by a bipolar differential current switch TL-TR. Read current is provided by a common current source Is, which is supplied by a sense amplifier (not shown). Data is read on the SAL and SAR line by means of a current steering sense amplifier circuit (not shown). Writing is performed by transistors T2 and T4, which are emitter dotted with other bit selects and are controlled by a write control circuit (not shown). During a WRITE operation, one side of the bit column (either BL or BR, depending on the data) will be pulled negative by either T2 or T4. Writing of the cell is done in a complementary way. The high side of the bit line will source current into the cell while the low side will pull current out of it. This complementary write scheme enables a very fast write time.

Some of the features and advantages of the bit decoder and bit select circuits of the invention are summarized below:

(a) High Speed-Since the first bit address line (IN1) is fed into a PFET inverter in the bit decoder (FIG. 5) with dual phase emitter-follower outputs, the decoder delay is kept to a minimum. Furthermore, since the PFET device P1 is never completely shut OFF but instead is purposely maintained lightly ON during standby state, its switching delay is thus also minimized. By means of two-level decoding, only three inputs are needed in each bit decoder for 1/256 selection. This not only reduces the circuit's device count, but also lowers the capacitive loading seen at node 1. Circuit complexity and performance are both improved.

(b) Simplified restore-In addition to the normal read/write decode signal, the bit decoder also provides a restore signal to the bit select circuit. Bit line restore will automatically occur at the proper time when the bit decoder is deselected. Thus, no explicit restore timing or clock drivers are needed.

(c) Saturation & stability control - The current mirror emitter follower configuration (T2-T3) (FIG. 5) serves two functions. First, T2 acts as an anti-saturation clamp for transistor T3 while the decoder is selected. When restore falls towards the saturation region, the VBE of T3 increases at a higher rate than that of T2. Excessive base drive from P1 is steered through T2, thus preventing T3 from going into heavy saturation. Second, T2 also acts as an oscillation clamp for the bit decode line. Since the bit decode drives into large current switches, the highly inductive loads tend to make it less stable. T2 helps to attenuate the gain of the emitter follower configuration for better stability.

Word Addressing and Decoding Scheme

Figure 7:
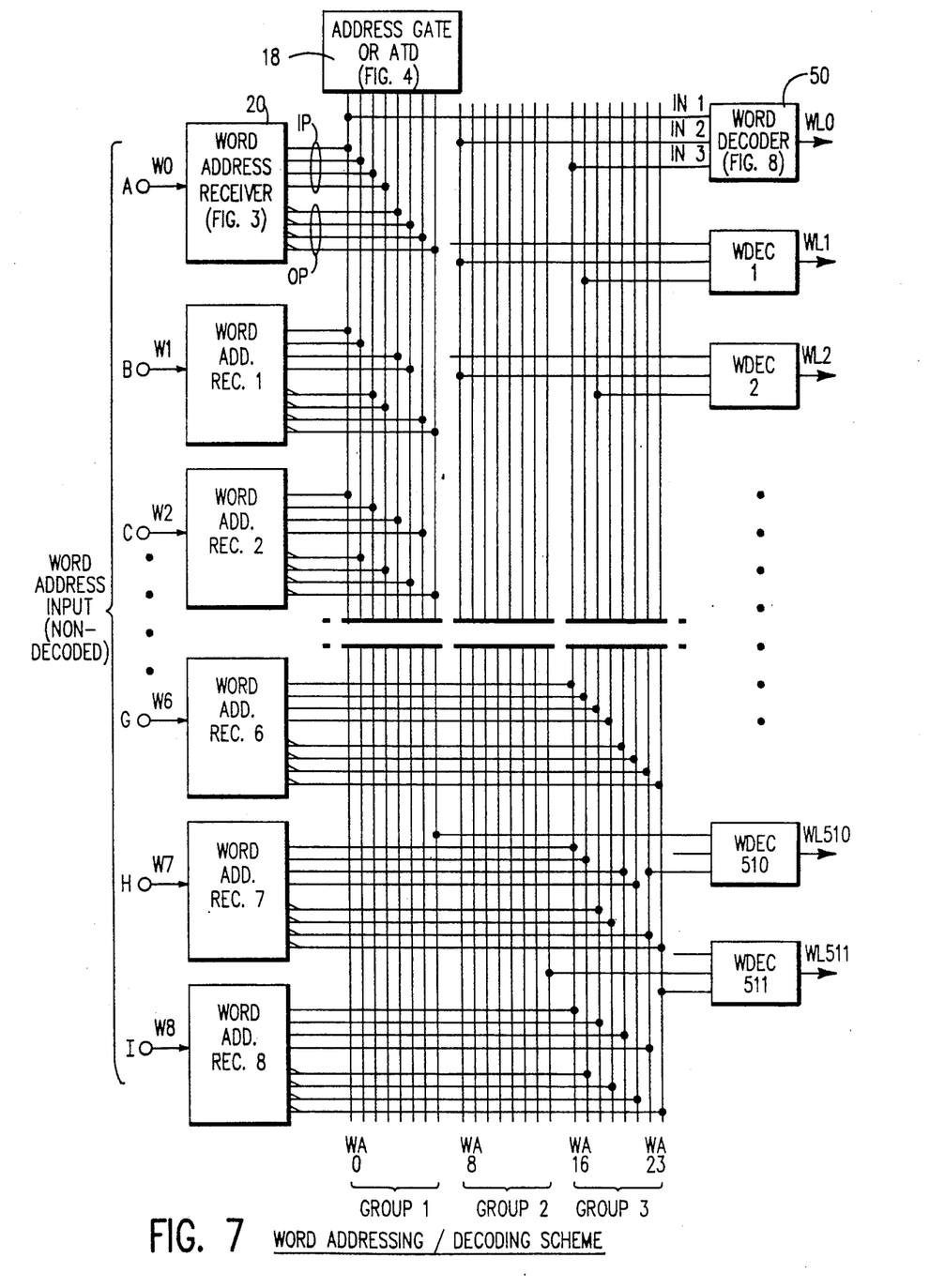
FIG. 7 is a block diagram of a memory word address and decode scheme in accordance with the invention.
Figure 10:
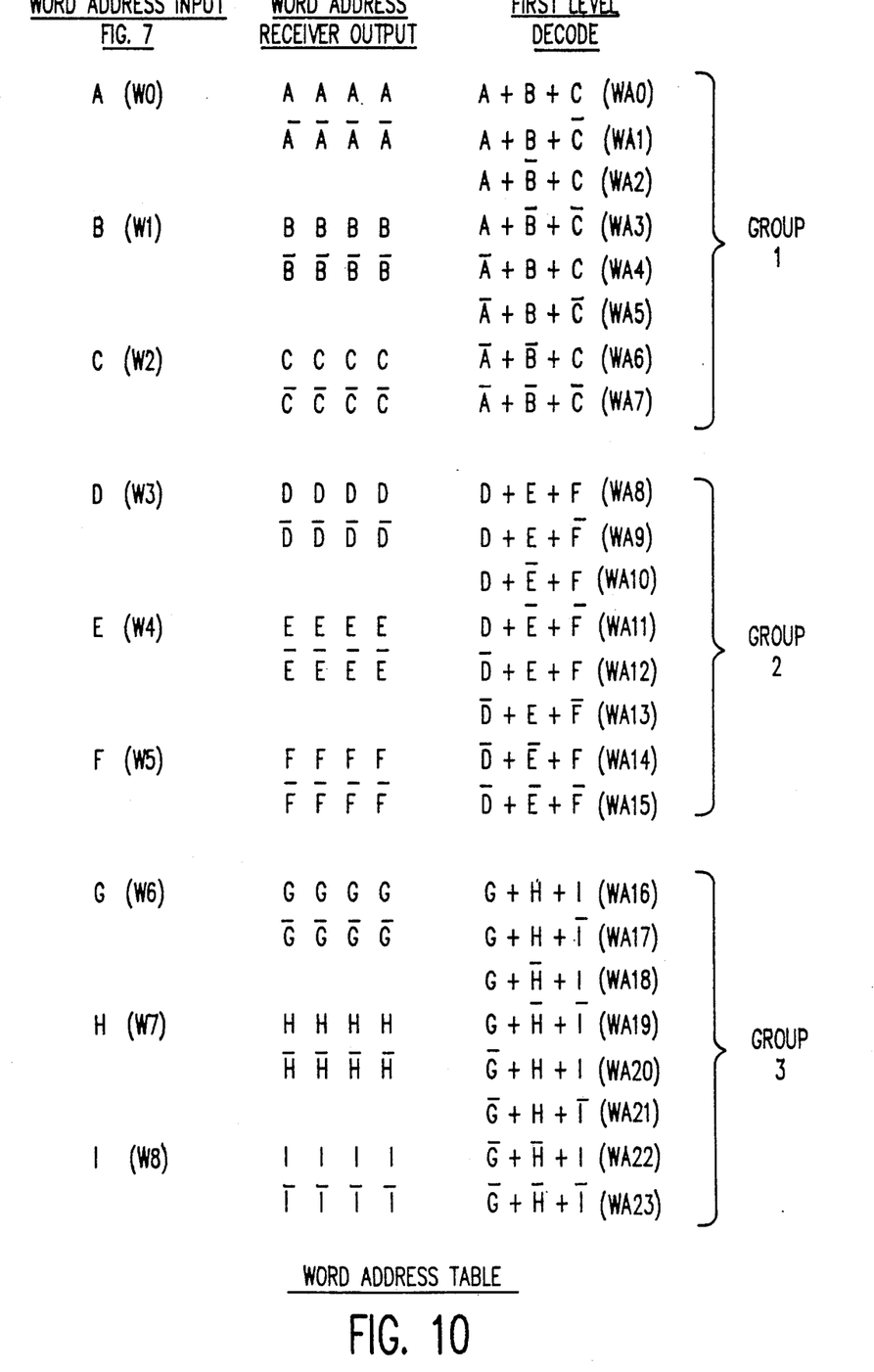
FIG. 10 is an address table showing a typical first-level (partially decoded) word address output of the word address receiver circuits 20 of FIG. 7.

The word address and decode circuits 14 of FIG. 1 of the invention will now be described. Turning to FIG. 7, there is shown a more detailed block diagram of the word address and decode circuits 14. In this two-level matrix decode scheme, a plurality of non-decoded word address signal lines (W0 ... W8) are input to a plurality of word address receiver circuits 20. In the preferred embodiment, each receiver circuit, which may be the same type of receiver circuit as the bit receiver of FIGS. 2 and 3, has one input and a plurality of outputs (e.g., eight) to provide a first-level decode (partially decoded, or intermediate) word address for one bit of the address. Four of the outputs are in-phase with the input (labelled "IP"), and four of the outputs are out-of-phase (labelled "OP"). (See also FIG. 10.)

The outputs of the address receivers are connected to 24 word address lines, WA0 ... WA23, in various combinations to provide a complete first-level word decode. These address lines are grouped into three groups— group 1 comprising WA0-WA7, group 2 comprising WA8-WA15 and group 3 comprising WA16-WA23— as shown in FIG. 7, for proper connection to a second level of decoding circuits for the word address.

The second level of word decoding is performed by a plurality of word decoder circuits 50. To handle the word decoding for a 256 Kbit SRAM, as in one embodiment of the present invention, 512 of the word decoders 50 are required, each of which has a plurality of inputs, such as IN1, IN2 and IN3. Each input is connected to one line within each group of intermediate word address lines (first level word decode output lines), in various combinations.

Address gate 18 releases the first level outputs into the word decoders when reading or writing is to begin, and deselects the decoders during standby. As previously noted, gate 18 could operate in synchronous mode with a clock, or it could be replaced by an ATD circuit for asynchronous operation.

The two-level matrix word decode scheme utilized in the present invention offers a significant advantage over a single-level scheme in terms of reduced fan-out on the word address lines. A four-fold reduction of fan-out is achieved (i.e., fan-out to only 64 decoders instead of 256), and switching speed of the address lines is significantly improved. The number of inputs to each word detector is also reduced from 9 to 3. In addition, all circuits of the decode scheme may be fabricated on a single semiconductor chip, together with the array.

Figure 8:
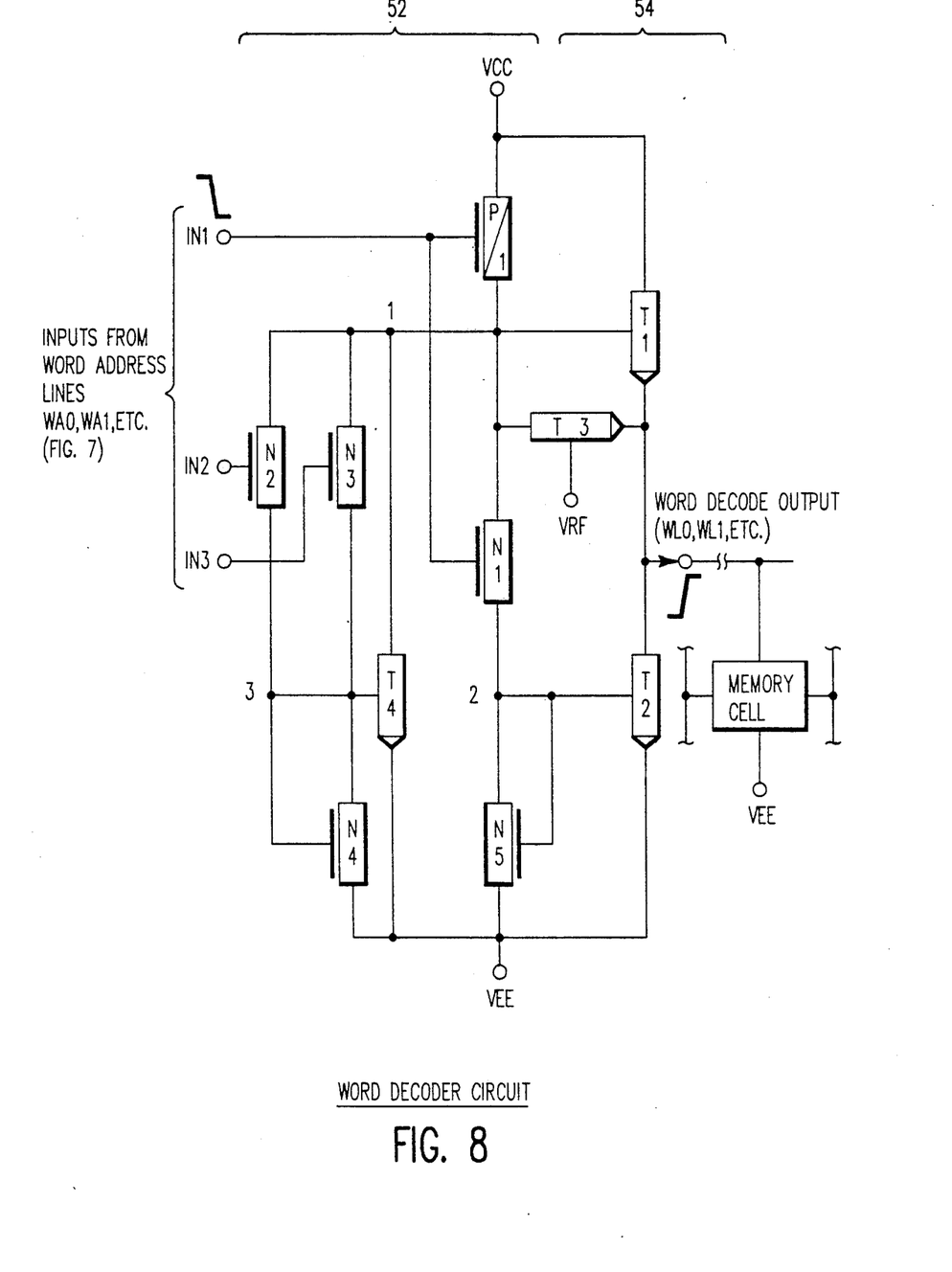
FIG. 8 is a schematic circuit diagram of a word decoder circuit 50 that may be employed in a memory-word address scheme (FIG. 7) in accordance with the invention.

Preferred embodiments of the address receiver circuit 20, address gate 18, and the word decoder circuit 50 of the present invention are shown in more detail in FIGS. 3, 4 and 8, respectively. The address receiver and address gate circuits have been previously described.

Word Decoder Circuit

Turning now to FIG. 8, there is shown a BICMOS implementation of the word decoder circuit 50 of FIG. 7, in accordance with the invention. A noteworthy feature of the invention is that the word decoder circuit comprises a BICMOS decode portion 52 coupled to a drive portion 52. Decode portion 52 also operates as a logical NOR/OR circuit. The circuit of FIG. 8 has a plurality of inputs (three in the preferred embodiment, namely IN1, IN2 and IN3), and one output, namely "word decode." The inputs are taken from the word address lines of FIG. 7, and the output of each decoder circuit is coupled to a word line of the memory array for connection to a row of memory cells.

In the preferred embodiment, decoder or NOR/OR portion 52 comprises a 3-input, 2-output, 7-device circuit comprising 5 NFETs, one PFET and one bipolar transistor. The inputs IN1, IN2 and IN3 are coupled, respectively, to the gates of three NFETs, N1, N2 and N3. Input IN1 is also coupled to the gate of a PFET P1, whose source-drain current path is coupled in series with the source-drain current path of N1 to form an inverter. The source-drain current paths of the input NFETs N2 and N3 are coupled in parallel between internal nodes 1 and 3 of this circuit. Device P1 has its source-drain current path coupled in series with a first voltage source VCC, input NFET N1, node 2, an optional bleeder NFET N5, and a second voltage source VEE. Node 1 provides one "output" for portion 52 (comprising a NOR voltage), and node 2 provides the other "output" for portion 52 (comprising an OR-equivalent current).

Another noteworthy feature of portion 52 of the word decoder circuit 50 of FIG. 8 of the invention is the bipolar transistor T4, which is an NPN transistor in the preferred embodiment. In a departure from the prior art, transistor T4 is used not only for driving (pulling down) node 1 when the decoder circuit is deselected, but is also used to help accomplish the basic NOR/OR logical operations of portion 52. This is achieved via the clamping action that T4 performs on node 1 when either IN1, IN2 or IN3 is "high." To "counteract" P1, which tries to pull node 1 up during certain combinations of inputs, T4 must pull node 1 down to provide proper logical NOR/OR outputs. Portion 52 of FIG. 8 will not provide a correct logical NOR output signal at node 1 in the absence of bipolar transistor T4. Transistor T4 also helps reduce the effect of noise at the inputs IN1-IN3 on the output at node 1, and eliminates the need for series-connected PFET devices at the input.

Another feature of the invention is that PFET device P1 functions as an active pull-up device for node 1, and P1, in conjunction with device N1, also assists in the input decoding of the partially-decoded (intermediate or first-level decode) word address at IN1-IN3. Only one PFET is needed in this circuit.

Still another feature of the invention is that P1 is always at least slightly "ON," even in the standby mode. This is accomplished by properly adjusting the input "up" level taken from the address receiver circuit (FIG. 3), and by adjusting the PFET turn-on threshold voltage (for example, during manufacture). As IN1 goes from "OFF" to "ON" (e.g., from "high" to "low," the P1 output goes from "slightly on" to "fully on." This provides significantly increased speed for memory addressing, and hence reading and writing, operations.

To complete portion 52 of the circuit of FIG. 8, devices N4 and N5 operate as optional bleeder or discharge (pull-down) devices for nodes 3 and 2, respectively, and devices N5 and T2 also operate together as a voltage clamp on node 2.

Portion 52 is coupled to a drive portion 54 of FIG. 8 at nodes 1 and 2. In the preferred embodiment, drive portion 54 comprises a 2-input, 1-output, 3-device bipolar circuit providing word decode at the output, and driven by transistors T1 and T2 in a push-pull configuration. The word decode output is taken from the emitter of transistor T1 (collector of T2). The "inputs" for circuit portion 54 are taken from nodes 1 and 2 of portion 52, and are coupled to the bases of transistors T1 and T2, respectively. Transistor T3 acts as a down-level anti-saturation clamp for T2. Transistor T2 is biased in unique fashion by current from node 2, provided by NFET N1 in portion 52.

Word Decoder Circuit Operation

The operation of the circuit of FIG. 8 will now be described. Reference should also be made to the waveforms of FIG. 11.

The second level decode function is performed by a high speed word decoder (FIG. 8) which has a BICMOS front-end and a push-pull bipolar output. The three decode inputs are each connected to an address line in the three address groups. All 3 inputs must be low in order to select a word line. Of the 512 word decoders, only one is decoded to drive a selected word line high. Each word decoder output (WL) is fanned out to 512 memory cells, so that all the cells that are attached to it will be activated when the word line is selected or deselected.

(i) Standby/unselect state: In standby state, the outputs of address gate 18 (FIG. 3) are high. At least one input (IN1, IN2 or IN3) is up to disable the decoder. In this state, the PMOS device P1 (FIG. 8) is maintained "lightly" ON because of the particular voltage level chosen as its threshold voltage, which is lower than a VBE voltage. The NMOS device N1 is turned "fully" ON to clamp down node 1, thereby shutting OFF the emitter follower T1. A small DC current supplied by P1 is conducted through N1 to kept the word line pull down transistor T2 ON. The WL unselect level is defined by transistor clamp T3, which is controlled by a voltage reference source (VRF) generated on-chip to track with power supplies and device variations.

(ii) Select state: To select a word decoder for a memory read or write operation, all three of the decoder inputs must be low. The NMOS devices N1-N3 are turned OFF while the PMOS device P1 is switched from "lightly" ON to "fully" ON. Node 1 is thus pulled up to VCC and T1 is turned ON rapidly to drive the word line high.

The word decoder/driver circuit described above has the advantages of very fast switching speed and low circuit complexity. Since the first word address line is fed into a PMOS inverter with a bipolar emitter-follower pull up (FIG. 8), the decoder delay is kept to a minimum. Furthermore, since the PMOS device P1 is never completely shut-OFF but instead is purposely maintained lightly ON during standby state, its switching delay is thus also minimized. By means of two-level decoding, only three inputs are needed in the word decoder for 1/512 selection. This not only reduces the circuit's device count, but also lowers the capacitive loading seen at node 1. Circuit complexity and performance are both improved.

While the invention has been particularly shown and described with reference to the preferred embodiments thereof, it will be understood by those skilled in the art that various changes in form and detail may be made therein without departing from the spirit and scope of the invention. For example, the NFET transistors in the embodiments could be replaced by PFET transistors, and vice versa, with appropriate modification, and the NPN bipolar transistors could be replaced by PNP transistors, and vice versa, with appropriate modification. The invention may also, for example, find application in other types of memories, such as multiple port (using different cells), read-only, optical or electro-optical, in which case the "signals" referred to herein could be light pulses instead of voltage levels.

We claim:

1. A BICMOS word decode circuit for a static random access memory array, comprising:
   first and second input field-effect transistors (FETs) of opposite conductivity type connected in series between a first voltage source and second node, having a first node to define the connection of the source and the drain of said first and second input FET's respectively;
   a first input terminal connected to control gates of the first and second input FETs;
   third and fourth input FETs connected in parallel between the first node and a third node;
   second and third input terminals connected to control gates of the third and fourth input FETs, respectively;
   a bipolar transistor connected between the first node and a second voltage source, a control terminal of the bipolar transistor being connected to the third node; and output driving means connected between the first and second voltage sources, having inputs that are connected to the first and second nodes, responsive to the signals at the first and second nodes for producing word decode signals which are a direct function of the signals at the first and second nodes.

2. The BICMOS word decode circuit of claim 1 in which the output driving means comprises two bipolar drive transistors in a push-pull configuration, the emitter of one bipolar drive transistor being arranged to provide the word decode signals.

3. The BICMOS word decode circuit of claim 1 further including a first discharge device coupled between the second node and the second voltage source, and a second discharge device coupled between the third node and the second voltage source.

4. The BICMOS word decode circuit of claim 2, further comprising an anti-saturation clamp comprised of a bipolar transistor coupled between the emitter of one bipolar drive transistor and the first node, and having a reference voltage connected to the control terminal.

5. The BICMOS word decode circuit of claim 3 in which each discharge device comprises an FET, each of which has a control gate coupled to a drain terminal.

* * * * *